United States Patent [19]

Dickson et al.

[11] 3,986,107

[45] Oct. 12, 1976

[54] RESISTANCE INDICATING ELECTRICAL TESTING EQUIPMENT FOR TESTING INSULATION UNDER HIGH VOLTAGE CONDITIONS

[75] Inventors: Alan Scott Dickson, Strathaven; James Rodger Campbell Leitch, Glasgow, both of England

[73] Assignee: Edgcumbe Peebles Limited, Glasgow, England

[22] Filed: Jan. 20, 1975

[21] Appl. No.: 542,513

[30] Foreign Application Priority Data
Jan. 19, 1974 United Kingdom ............... 2618/74

[52] U.S. Cl. ........................... 324/54; 323/9
[51] Int. Cl.² ............... G01R 31/12; G01R 27/02; G05F 1/10
[58] Field of Search ............. 324/51, 54, 62; 323/9, 323/DIG. 1, 17, 20

[56] References Cited
UNITED STATES PATENTS

| | | |
|---|---|---|
| 2,697,811 | 12/1954 | Deming .......................... 323/9 X |
| 3,201,680 | 8/1965 | Ross et al. ....................... 323/9 |
| 3,277,364 | 10/1966 | Abrahamson .................... 324/54 |
| 3,284,707 | 11/1966 | Clinton ......................... 324/51 X |
| 3,413,541 | 11/1968 | Swim et al. ..................... 324/54 |
| 3,491,290 | 1/1970 | Peschel .......................... 324/54 |
| 3,509,451 | 4/1970 | Garrett .......................... 323/9 X |
| 3,571,697 | 3/1971 | Phillips .......................... 323/17 |
| 3,602,801 | 8/1971 | Williamson ..................... 323/17 |
| 3,701,937 | 10/1972 | Combs ........................ 323/20 UX |
| 3,872,384 | 3/1925 | Laass ............................ 324/51 |

*Primary Examiner*—Gerard R. Strecker
*Attorney, Agent, or Firm*—Larson, Taylor and Hinds

[57] ABSTRACT

An electrical testing device for indicating resistance when testing insulation under high voltage conditions by supplying a high voltage which is monitored and controlled to prevent excessive power consumption when the insulation being tested is faulty. The device may be operated in an alternative mode to test continuity at low voltage.

13 Claims, 3 Drawing Figures

RESISTANCE INDICATING ELECTRICAL TESTING EQUIPMENT FOR TESTING INSULATION UNDER HIGH VOLTAGE CONDITIONS

The present invention relates to electrical test equipment and, in particular, to devices for indicating the degree of insulation or continuity of an electrical circuit by indicating the resistance of the circuit.

In electrical supply circuits it is often desirable to determine the degree of insulation between, for example, the live circuit and earth. Conventionally this is usually done by means of a testing device incorporating a 500 volt supply which is connected across the live circuit and earth and the device then monitors the current flow to determine the electrical resistance across the 500 volt supply. Clearly if a short circuit were present across the 500 volt supply an excessive current would flow if no precautions were taken and such an excessive current flow would present severe practical drawbacks in constructing the testing device as well as giving rise to a risk of damage and injury being caused.

Known testing devices are therefore usually arranged to read the resistance of the tested circuit only down to a predetermined allowable minimum value, for example, 1 Megohm as the allowable minimum supply-to-earth resistance. The devices may be arranged so that they "cut-off" at the allowable minimum i.e. when a resistance of less than the allowable minimum is present across the 500 volt supply the device effectively switches itself off. Alternatively some devices are arranged to "fold back" i.e. their voltage-current characteristic curve shows a decreasing voltage and current output when the resistance in the output circuit is below the predetermined allowable minimum. Both forms of known device give no useful information when the tested circuit resistance is below the allowable minimum and so can give no guide as to fault location in such circumstances.

According to the present invention there is provided an electrical testing device having a means for supplying power to be connected across a circuit whose insulation is to be tested, means for monitoring and controlling the output of the power supplying means and means connected to the monitoring means and to the power supplying means and arranged to provide a voltage-current output characteristic to control the power supplying means through the monitoring means, the characteristic comprising one or more substantially linear portions extending from a predetermined voltage value and substantially zero current to a predetermined current value and substantially zero voltage at least one of said substantially linear portions corresponding to a constant rate of decrease in voltage with increase in current.

Preferably said testing device is arranged to provide a substantially constant output voltage across the circuit being tested over a range of current values from zero current to a predetermined allowable value corresponding to an allowable minimum value of resistance for the circuit to be tested, the output voltage then being progressively decreased to zero with increasing output current in accordance with said one substantially linear portion.

Embodiments of the present invention will now be described, by way of example only, with reference to the accompanying drawings wherein.

Figure 1:
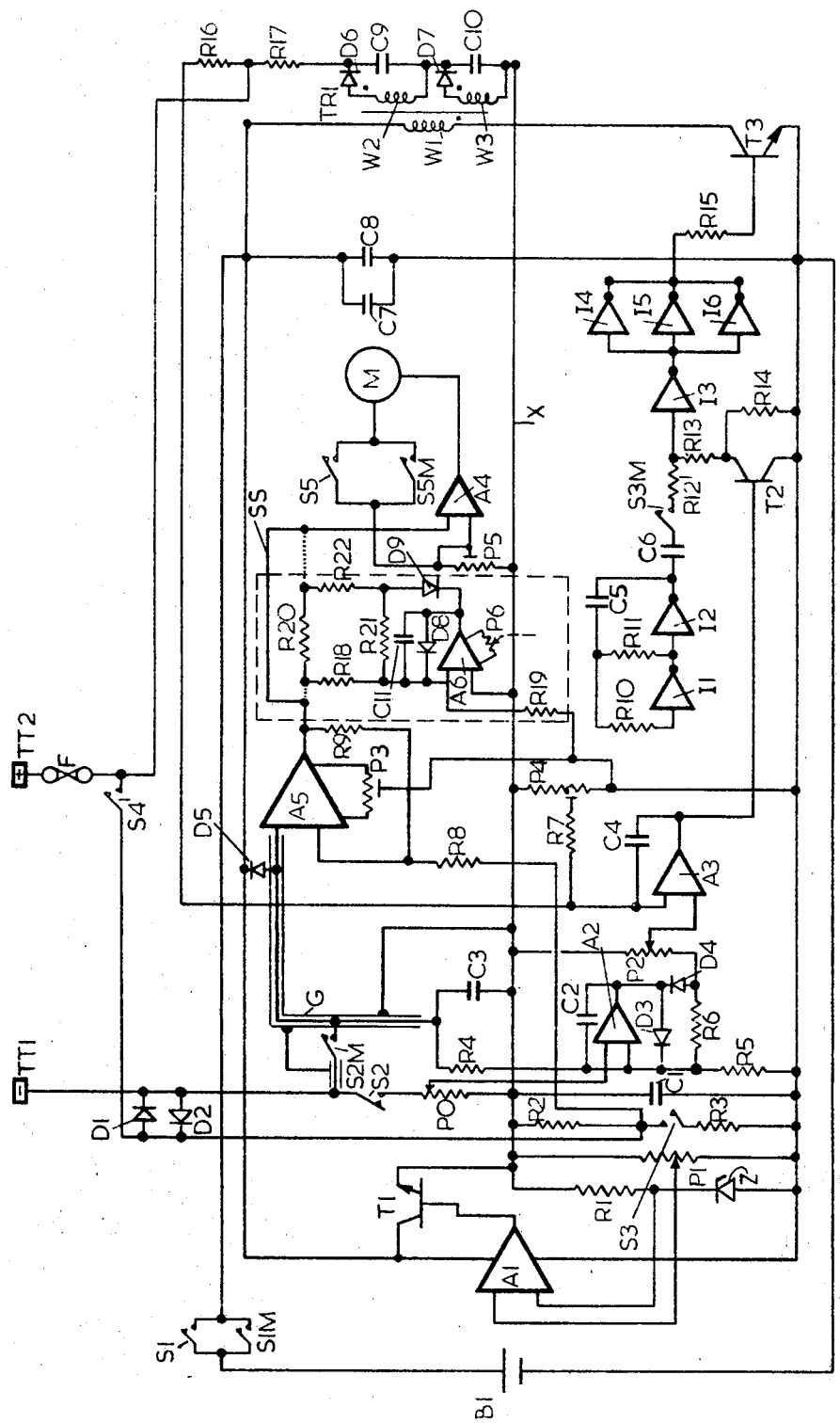
FIG. 1 is a circuit diagram of a testing device embodying this invention.

Referring to the drawings, the test instrument shown enables the resistance of an electrical circuit to be measured and operates in two alternative modes. In one mode the instrument tests continuity at low voltage e.g. around 200 m V and in the other mode the instrument tests insulation at a voltage which can be selected up to a relatively high value e.g. 100 – 1000 volts. In the latter mode, as mentioned earlier, it is important that the current supplied by the instrument is just sufficient to develop the required voltage across the resistance being measured to optimise the efficiency of power usage and so maximise battery life in battery-powered instruments of which the instrument described here is one.

Also it is desirable that there be as little risk of damage or injury as possible in view of the unknown nature of the circuit to be tested.

In FIG. 1, a battery B1 is selectively connected into circuit by means of either of switches S1, S1M. In the circuit the operating mode is selected by means of either ganged switches S$n$ or ganged switches S$n$M where $n$ is the reference numeral used.

Capacitors C7, C8, connected in parallel, provide a certain amount of short term stability to the supply voltage and further longer term stabilisation is provided by means of an amplifier A1 whose output controls the base of a transistor T1. The inputs of the amplifier are connected to respective voltage dividers comprising a potentiometer P1 and a series arrangement of a resistor R1 and zener diode Z. The collector of the transistor T1 is connected to the positive lead from the capacitors C7, C8 and the emitter of the transistor provides a stabilized voltage between lead X and the negative terminal of the battery. The voltage dividers provided by P1 and R1, Z are connected in parallel across the stabilised supply. The power to the amplifier A1 is obtained from the short term stabilised battery supply and the amplifier operates to control the transistor T1 so that the latter maintains a fixed voltage relationship between the inputs of the amplifier, thus stabilising the voltage across P1 and R1, Z.

To test continuity, the switches S1, S2, S3, S4 and S5 are closed. This provides a voltage (of about 200 mV) across resistor R2 in parallel with the circuit being tested across the testing terminals TT1 and TT2. Diodes D1 and D2 are protective threshold diodes to short circuit any damaging voltages (for example, over 500 m V) appearing across TT1 and TT2 so that the short circuit current will blow fuse F in series with TT2.

The current supplied via TT1 and TT2 flows from the junction of lead X, and resistor R2, through fixed potentiometer P0, switch S2, terminal TT1, through the circuit being tested, through terminal TT2, fuse F, switch S4 and so to the junction of R2 with resistor R3 via switch S3.

The actual value of the voltage at the junction of R2 and R3 relative to lead X will depend on the resistance of the circuit under test and amplifier A5 has one of its two inputs connected via resistor R8 to the junction of R2 and R3. The other input of the amplifier A5 is connected via resistors R4, R6 and potentiometer P2 to lead X. Diode D5 ensures that this input of A5 is never wrongly biased.

Thus the voltage across R2 is detected by amplifier A5 whose output signal is supplied to one input of amplifier A4 whose other input is at a voltage determined by the current through potentiometer P5. However for a given voltage at the output of A5 the amplifier A4 will maintain the current constant through meter M, switch S5 (or S5m) and potentiometer P5 so that for a given setting of P5 the same reading will always appear for that given voltage at the output of A5. This compensates for any temperature effects in the meter M, for example.

Thus depending on the resistance of the circuit under test for continuity a voltage will appear across R2 which will be amplified by A5 and A4 to provide a reading on the meter M which can be calibrated by means of P5 to indicate the resistance of the circuit under test.

Figure 2:
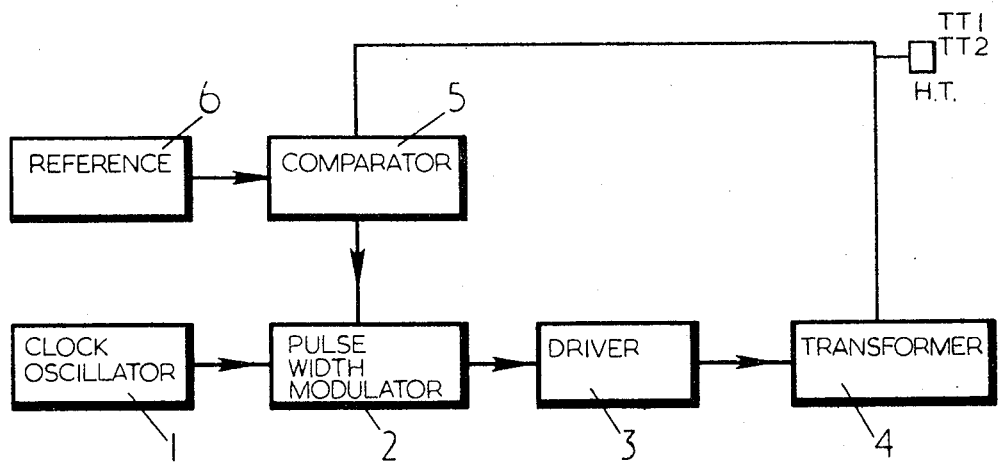
FIG. 2 is a block diagram of part of the device shown in FIG. 1.

To test the insulation of a circuit it is necessary to close the switches S1M, S3M and S5M (the switches Sn being open). The operation of the device in this mode will first be described with reference to FIG. 2 which illustrates the arrangement for controlling the high voltage output power of the testing device.

A clock pulse generator 1 is connected to a pulse width modulator 2 which adjusts the width of the pulses supplied to a drive circuit 3 which in turn drives a step-up transformer 4. The high voltage output of the transformer is dependent on the width of the pulses from the modulator 2 and is supplied across the terminals TT1, TT2 and, at the same time a comparator 5 compares the transformer output voltage with a reference voltage from a reference circuit 6. The output of the comparator is supplied to the pulse width modulator 2 to vary the pulse width to vary the transformer output voltage so as to maintain the desired predetermined relationship between the reference voltage and the transformer output voltage. The reference circuit 6 produces a stabilised constant reference voltage output over a predetermined range of output current from the transformer. This range of output current extends continiously from substantially zero to a predetermined allowable value corresponding to the predetermined allowable minimum resistance of the circuit under test, for example, 1 Megohm.

Thus, over this range of output current, the reference input of the comparator 5 is at a substantially constant reference potential and the other input is also maintained at a substantially constant potential by the action of the modulator 2. Thus the voltage applied across the circuit under test is kept substantially constant over the predetermined range of current from zero to said allowable value.

To maintain 500 volts across the circuit under test even when a fault has caused the resistance of the circuit under test to reduce to, for example 500 ohms would require a current output of 1 amp and the situation becomes rapidly worse as the resistance of the circuit under test approaches short-circuit levels.

To ensure that the current output of the testing device remains within reasonable bounds, considering the desirability of using small capacity dry batteries to power the device and considering the limitations of such a dry battery power supply, the reference circuit 6 is arranged to start changing the signal to the reference input of comparator 5. The circuit 6 does this in such a way that the comparator causes the voltage characteristic across the circuit under test to decrease to zero in a substantially linear manner over a finite, non-zero range of output current from said allowable value to a maximum value which will ensure a required degree of safety and will enable a convenient and economic dry battery supply to be used to power the testing device.

Figure 3:
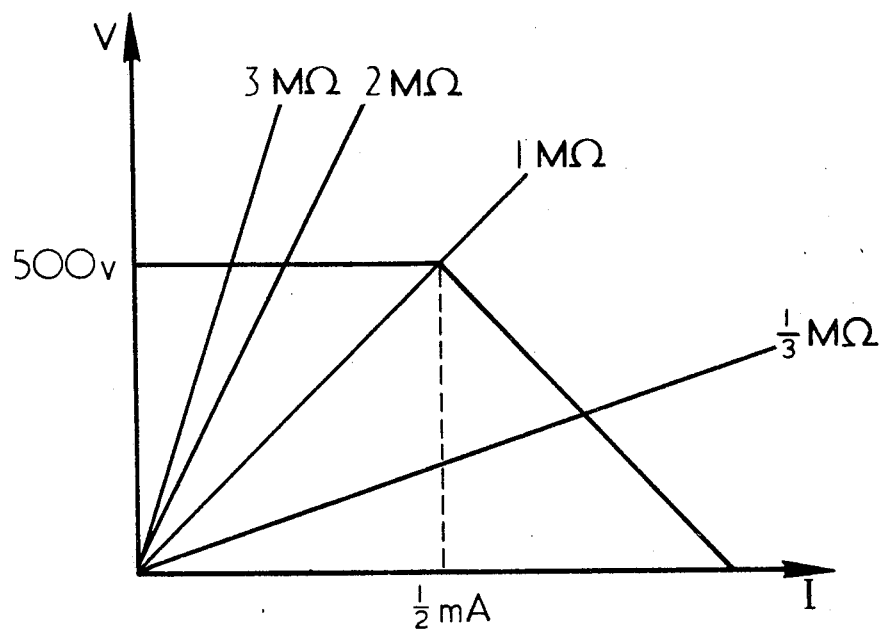
FIG. 3 is a graph of the voltage-current characteristic of the output from the testing device shown in FIG. 1.

The voltage-current output characteristics of the testing device is shown in FIG. 3 and the lines radiating from the origin correspond to some of the values of resistance in the range from zero to infinity covered by the output characteristic curve of the device. The point where a given one of the radiating lines intersects the characteristic curve corresponds to the output voltage and output current values associated with the resistance value represented by the radiating line. It can be seen that there is a one to one correspondence between the radiating lines and the range of current covered by the characteristic curve. Thus each value of current indicated by indicating means (such as the meter M shown in FIG. 1) of the testing device corresponds to a value of resistance so that the indicating means can be calibrated appropriately.

Referring again to FIG. 1, the clock pulse generator comprises inverters I1, I2, resistors R10, R11 and capacitor C5 and provides a square wave pulse output at a constant frequency. The output of the clock pulse generator is supplied to a capacitor C6 in series with switch S3M, resistors R12, R13 and a parallel arrangement of resistor 14 with the emitter-collector circuit of transistor T2. The junction of R12 and R13 is connected through inverter I3 to a parallel arrangement of inverters I4 to I6. The time constant of the circuit C6, R12, R13, T2, R14 is dependent on the conductivity of transistor T2 and determines the decay time of the voltage through capacitor C6 due to each pulse from the clock pulse generator. This decay time determines the width of each pulse produced at the common output of the inverters I4 to I6.

The pulses from the inverters I4 to I6 are supplied to the base of transistor T3 via resistor R15 so that the fraction of each unit of time for which the transistor T3 conducts depends on the width of the inverter pulses. The collector-emitter circuit of the transistor T3 is in series with the primary winding W1 of transformer TR1. Thus the time for which the transistor T3 conducts determines the energy stored in the primary winding and this energy is transferred to the secondary windings W2, W3 and arranged by means of diodes D6 and D7 and capacitors C9 and C10 to provide a high voltage D.C. output whose positive pole is connected via resistor R17 to testing terminal TT2 and whose negative pole is connected via lead X, potentiometer P2, resistors R6 and R4 and switch S2M to testing terminal TT1.

The current drawn via TT1 and TT2 depends on the resistance of the circuit under test and is detected by amplifier A5 at its input connection to the junction of switch S2M and resistor R4. The other input of amplifier A5 is held at a fixed voltage via resistor R2.

Thus as in the continuity test the resistance of the circuit under test is detected as a voltage by amplifier A5 whose output is used to provide an indication of the measured resistance on meter M via amplifier A4.

To control the output voltage from transformer TR1, amplifiers A2 and A3 and associated circuitry control the base signal of transistor T2 to automatically adjust the pulse width of the output of inverters I4 to I6 to control the transformer appropriately.

The amplifier A3 has one of its inputs connected to the positive pole of the transformer output via resistor R16 which feeds a current proportional to the transformer output voltage back to the amplifier input. A capacitor C4 is connected between this amplifier input and the amplifier output to integrate out any ripple which might affect the amplifier. (Amplifier A2 has a similarly operating capacitor C2). The voltage developed at the amplifier input is determined by resistor R7 and preset potentiometer P4. The other input of the amplifier A3 is connected via the tap of potentiometer P2 to a reference circuit in which the amplifier A2 has one of its inputs held at a steady potential via fixed potentiometer P0 and the other of its inputs is connected to the terminal TT1 via switch S2M and resistor R4. This latter input is also connected to the output of amplifier A2 via a feedback circuit comprising diodes D3, D4 and resistor R6.

While the current drawn from the testing device by the circuit under test corresponds to the latter having a resistance 1 Megohm or more the tap of P2 supplies a constant reference voltage to A3 which acts to keep the transformer output voltage (and hence the voltage relationship between the inputs of the amplifier A3) constant.

When the current drawn from the testing device exceeds the predetermined allowable value the voltage across R5 becomes such that the amplifier A2 acts to reduce the reference voltage to A3 along a linear slope as shown in FIG. 3. Potentiometers P2 and P3 enable the setting of conditions at the end points i.e. the short circuit and open circuit conditions respectively.

Also for a given setting of P4 a suitable choice of R5 must be made to determine the "predetermined allowable minimum" resistance of the circuit under test.

Capacitors C1 and C3 are provided for noise suppression and since the circuit will usually be formed on a printed circuit board, the lead portion to the input of amplifier A5 from terminal TT1 is provided with a screening guard G (to prevent leakage at high voltage) connected electrically to the positive pole of the stabilised battery supply.

Shown within the broken line box is an optional auxiliary circuit portion which can be provided in place of the short circuit portion SS between the output of A5 and the input of A4. The dotted lines shown connecting resistor R20 across the portion SS indicate that the output of A5 is connected to the input of A4 only through R20 when SS is omitted. By means of a connection through resistor R19 to one input of amplifier A6 (the other input being connected directly to the positive pole of the stabilised battery supply) the amplifier A6 can in association with the circuit comprising resistors R18, R21 and R22, and diodes D8 and D9 alter the response of the device so as to compress the scale of resistance indication when very high resistance circuits are being tested. Capacitor C11 integrates out any ripple across the amplifier A6.

While the testing device described above has been described as an example of one form of this invention various changes and modifications could be made within the scope and spirit of this invention. For example the polarities of some or all of the connections made may be reversed by using suitable replacement components where necessary. Also the device may be operated from the mains through a suitable transformer as well as or instead of being battery-powered.

What is claimed is:

1. An electrical testing device having a pair of terminals between which can be connected a circuit whose insulation is to be tested, power supplying means for supplying an electrical voltage to the terminals, means for generating first and second electrical signals dependent on the electrical current supplied through the terminals by the power supplying means, means for measuring and indicating the value of the first electrical signal, means for receiving and sensing said second electrical signal, control means for controlling the power supplying means, means for connecting the power supplying means and said signal generating means to said terminals so that the signal generating means detects the terminal current so as to enable the generation of said first and second electrical signals, means for connecting the measuring and indicating means to said signal generating means so that said measuring and indicating means receives said first electrical signal and indicates the measured value of the first electrical signal, means for connecting the sensing means to said generating means so that said sensing means receives the second electrical signal, the sensing means producing a third electrical signal dependent on said second electrical signal in accordance with a characteristic comprising at least one substantially linear portion, means for connecting the control means to the sensing means so that said control means receives the third electrical signal and to the power supplying means so that said control means receives a fourth electrical signal representative of the terminal voltage from the power supplying means and compares the third and fourth electrical signals to produce a fifth electrical signal dependent on the comparison, the control means being further connected to the power supplying means to supply the fifth electrical signal to the power supplying means so as to control the latter in a manner such that the terminal voltage-current characteristic depends on said third electrical signal and comprises at least one substantially linear portion, said characteristic extending from a predetermined terminal voltage value and substantially zero terminal current to a predetermined terminal current value and substantially zero terminal voltage, at least one end portion of said characteristic corresponding to a constant rate of decrease in terminal voltage with an increase in terminal current and terminating at said predetermined terminal current value.

2. A device according to claim 1 wherein said sensing means includes presettable means for varying the third electrical signal characteristic so as to vary the predetermined terminal current value at which the terminal voltage is substantially zero and thereby vary said constant rate to which corresponds said one end portion of the terminal voltage-current characteristic.

3. A device according to claim 1 wherein the sensing means comprises first means for providing the third electrical signal as a constant voltage for values of the second electrical signal corresponding to a range between zero terminal current and a predetermined allowable value of terminal current, and second means, connected to the first means, for cooperating with the first means to provide the third electrical signal as a constant rate of decrease in voltage with increase in terminal current, said second means being arranged to cut into operation when the terminal current exceeds said predetermined allowable value.

4. A device according to claim 1 wherein said sensing means includes a resistance, first and second diodes, a first amplifier having two inputs and an output, one of said inputs being connected to a source of constant potential and the other of said inputs being connected to the signal generating means so as to receive the second electrical signal, the first diode being connected forwardly from the amplifier output to said other input, and the resistance and the second diode being connected in series with and forwardly between said other input and the amplifier output, the third electrical signal being supplied by means of the junction between the resistance and the second diode, said first amplifier acting to vary the output thereof so as to maintain constant the potential difference between the amplifier inputs.

5. A device according to claim 4 wherein a presettable potentiometer has a winding connected to the junction of the resistance and the second diode, and a potentiometer arm connected to the control means for supplying the third electrical signal the level of which can be varied by means of the potentiometer so as to determine said constant rate to which corresponds said one end portion of the terminal voltage-current characteristic.

6. A device according to claim 1 wherein the control means includes terminal voltage detecting means, a second amplifier having two inputs and an output, the output of second amplifier being connected to the power supplying means, one of the inputs of said second amplifier being connected to the terminal voltage detecting means and the other of the inputs of said second amplifier being connected to the sensing means to receive the third electrical signal relative to which the second amplifier maintains said one input at a constant potential by varying the output thereof to control the power supplying means.

7. A device according to claim 6 wherein the power supplying means includes a step-up transformer, a drive circuit, a clock pulse generator and a pulse width modulator connected to the clock pulse generator for receiving and modulating pulses from the clock pulse generator, the pulse width modulator being connected to the drive circuit to supply pulses to the said drive circuit and said drive circuit connected to the step-up transformer to drive the transformer with said modulated pulses, said second amplifier output being connected to the pulse width modulator so as to vary the width of pulses supplied to the drive circuit and to thereby cause the transformer to produce an output voltage dependent on the pulse width.

8. A device according to claim 1 wherein the measuring and indicating means includes an indication circuit and a meter for indicating the resistance of the circuit under test, the indication circuit being connected to the signal generating means to receive said first electrical signal and being connected to the meter so that the meter reading depends on the first electrical signal and so that, for a given terminal current, the meter reading is constant for given settings of the components of the device.

9. A device according to claim 8 wherein said indication circuit includes a measuring circuit and an indication amplifier having two inputs and a resistive element, one of the inputs of the indication amplifier being connected to the measuring circuit to receive a voltage signal dependent on the first electrical signal and the other of the inputs of the indication amplifier being connected by means of the resistive element to the meter in series with the output of the indication amplifier, the current through the meter flowing through the resistive element and thereby determining the potential of said other input, the indication amplifier being arranged to vary the output thereof to maintain a predetermined voltage relationship between the inputs thereto.

10. A device according to claim 1 wherein switching means are provided for enabling the device to be operated selectively in one of two alternative modes, the switching means being connected to the signal generating means and to the terminals so that in one mode of operation the signal generating means supplies said second signal to an input of the sensing means so that the power supplying means exhibits said terminal voltage-current characteristic, and in the other mode of operation the signal generating means is isolated from the terminals and the power supplying means provides a constant terminal voltage.

11. A device according to claim 10 wherein in said other mode the device tests continuity and the power supplying means includes means for supplying a stabilized battery voltage to the circuit under tests, means being provided for detecting the current flow in the circuit under test due to the application of said stabilized battery voltage, and said measuring and indicating means being connected to said detecting means to provide an indication of the resistance of the circuit under test.

12. An electrical testing device according to claim 1 wherein the measuring and indicating means include means for compressing the indication scale for testing the insulation of high resistance circuits.

13. An electrical testing device according to claim 12 wherein said compressing means includes a series arrangement of at least first and second biassing resistors, and a compression amplifier having one input which is held at constant potential and another input which is connected to a point between the biassing resistors to which point is connected a predetermined potential by means of the first biassing resistor, said point also being connected to receive an input signal dependent on the measured resistance through a third biassing resistor, the compression amplifier being arranged to maintain a predetermined voltage relationship between the two inputs thereto, the second biassing resistor being connected, at its side opposite that connected to said first biassing resistor, to a series arrangement of two diodes connected forwardly to said other input, the output of the compression amplifier being connected to the common point of the two diodes, a series arrangement of fourth and fifth resistors being connected in parallel with the series arrangement of said second and third resistors, the compression means providing an output signal to the rest of the measuring and indicating means from the junction of the fourth and fifth resistors.

* * * * *